United States Patent [19]
Chien et al.

[11] Patent Number: 5,946,226
[45] Date of Patent: Aug. 31, 1999

[54] SRAM FOR SNM MEASUREMENT

[75] Inventors: Shun-Lee Chien, Taipei Hsien; Chao-Shuenn Hsu, Tainan Hsien; Yung-Tsai Hsu, Pingtung Hsien; Ji-Fu Chen, Chiayih Hsien, all of Taiwan

[73] Assignee: Winbond Electronics Corp., Hsinchu, Taiwan

[21] Appl. No.: 08/935,191

[22] Filed: Sep. 22, 1997

[30] Foreign Application Priority Data

Dec. 12, 1996 [TW] Taiwan ................................. 85219292

[51] Int. Cl.$^6$ ...................................................... G11C 11/00
[52] U.S. Cl. ........................................... 365/156; 365/206
[58] Field of Search .................................... 365/156, 154, 365/174, 206, 201, 177; 257/380, 369, 204, 401

[56] References Cited

U.S. PATENT DOCUMENTS

| | | | |
|---|---|---|---|
| 5,327,002 | 7/1994 | Motoyoshi | 257/380 |
| 5,600,589 | 2/1997 | Ishigaki et al. | 365/154 |
| 5,687,111 | 11/1997 | Wada et al. | 365/154 |

*Primary Examiner*—David Nelms
*Assistant Examiner*—Thong Le
*Attorney, Agent, or Firm*—Ladas & Parry

[57] ABSTRACT

In an SRAM for SNM measurement, the original word line of the SRAM cell for SNM measurement is divided into two segments for SNM measurement, wherein one segment is connected to the first node of the SRAM cell for SNM measurement, another segment is connected to the second node of the SRAM cell for SNM measurement. In addition, an adjacent word line adjacent to the SRAM cell for SNM measurement is connected to the SRAM cell for SNM measurement to form the word line of the SRAM cell. Therefore, the process of the SRAM for SNM measurement can be improved only by modifying the mask for the layout of the polysilicon layers in conventional ones.

5 Claims, 4 Drawing Sheets

5,946,226

SRAM FOR SNM MEASUREMENT

FIELD OF THE INVENTION

The present invention relates in general to an SRAM for SNM measurement (static margin noise measurement), and in particular, to an SRAM for SNM measurement which is manufactured by modifying the mask for the layout of the polysilicons in conventional SRAMs.

BACKGROUND OF THE INVENTION

FIG. 1 (Prior Art) is a circuit diagram of an SRAM cell. The SRAM cell 2 is comprised of a first resistor (impedance) R1, a second resistor (impedance) R2, a first MOS transistor T1, a second MOS transistor T2, a third MOS transistor T3 and a fourth MOS transistor T4. The first resistor R1, the first MOS transistor T1 and the second resistor R2, the second MOS transistor T2 are serially connected between a first voltage source and a second voltage source (for example, between a voltage source $V_{DD}$ and ground $V_{SS}$). The gate of the first MOS transistor T1 is connected to a second node B. The gate of the second MOS transistor T2 is connected to a first node A. Besides, the third MOS transistor T3 is connected between a first bit line BL and the first node A. The gate of the third MOS transistor T3 is connected to a word line WL. And, the fourth MOS transistor T4 is connected between the second bit line $\overline{BL}$ and the second node B. The gate of the fourth MOS transistor T4 is connected to the word line WL.

When the first node A is at a high voltage level (like the voltage source $V_{DD}$), the second MOS transistor T2 is turned on and the second node B is at a low voltage level (like ground $V_{SS}$). Therefore, the first MOS transistor is turned off and the node A remains at a high voltage level. In addition, when the first node A is at a low voltage level (like ground $V_{SS}$), the second MOS transistor T2 is turned off and the second node B is at a high voltage level (like the voltage source $V_{DD}$). Therefore, the first MOS transistor T1 is turned on and the first node A remains at a low voltage level.

FIG. 2 (Prior Art) is an equivalent circuit diagram of the SRAM cell in FIG. 1. The SRAM cell 2 in FIG. 1 can be regarded as a flip-flop comprising the inverters I and II of FIG. 2. Voltage source Vn is the noise of the circuit. In addition, FIG. 3 (Prior Art) is a diagram of the voltage transfer characteristic of the circuit in FIG. 2. The largest square between two curves (a dotted square in FIG. 3) is the noise margin, which can be used for measuring the circuit immunity. Consequently, the processing and yielding of a logic circuit can be greatly improved with reference of the noise margin measured.

FIG. 4 (Prior Art) is a diagram of the layout of a conventional SRAM. An active region 12 is defined by a field oxide layer 10 on a P-type semiconductor substrate 1. Polysilicon layers 142, 144, 146 are then dielectrically and selectively formed on the field oxide layer 10 and the active region 12. In this case, the polysilicon layer 142 is regarded as the gate of the first MOS transistor T1, the polysilicon layer 144 is regarded as the gate of the second MOS transistor T2, in addition, the polysiliconn layer 146 is regarded as the gate of the third MOS transistor T3, and the gate and the word line WL of the fourth MOS transistor T4. Further, N+ diffusion regions are doped in the active region 12 so as to form the drains and the sources of the first MOS transistor through the fourth MOS transistor T1, T2, T3, T4. The polysilicon layer 142 is coupled to the second MOS transistor T2 and the fourth MOS transistor T4 via buried contact so as to form the second node B. The polysilicon layer 144 is coupled to the first MOS transistor T1 and the third MOS transistor T3 via buried contact so as to form the first node A. For clarity, the first resistor R1 and the second resistor R2 are not shown in FIG. 4, and can be formed on the first MOS transistor through the fourth MOS transistor T1, T2, T3, T4 by polysilicon layers. Besides, the first and the second bit line BL, $\overline{BL}$ made of metal are formed on the first resistor R1 and the second resistor R2 so as to couple the third MOS transistor T3 and the fourth MOS transistor T4 via buried contact 182, 184.

In this embodiment, since the layout of the SRAM in FIG. 4 is comprised of a matrix, the SNM measurement can not be obtained through the first node A and the second node B. That is, the efficiency and the yield of the process can not be elevated.

SUMMARY OF THE INVENTION

The present invention provides an SRAM for SNM measurement. The SRAM for SNM measurement comprises an SRAM array on a semiconductor substrate with a plurality of bonding pads, and the SRAM array comprises at least one SRAM cell for SNM measurement. The SRAM cell comprises: a first MOS transistor having a first gate, a first drain and a first source, one of the first drain and the first source being coupled to a first voltage source; a second MOS transistor having a second gate, a second drain and a second source, one of the second drain and the second source being coupled to the first gate of the first MOS transistor to form a second node, and another one of the first drain and the first source of the first MOS transistor being coupled to the second gate of the second MOS transistor to form a first node; a first resistor, coupled between the first node and a second voltage source; a second resistor coupled between the second node and the second voltage source; a third MOS transistor having a third gate, a third drain and a third source, the third drain and the third source being respectively coupled to the first node and a first bit line, and the third gate being coupled to a word line; a fourth MOS transistor having a fourth gate, a fourth drain and a fourth source, the fourth drain and the fourth source being respectively coupled to the second node and a second bit line, and the fourth gate being coupled to the word line; and the SRAM cell for SNM measurement further comprising an original word line for SNM measurement having a first segment and a second segment, the first segment of the original word line being coupled to the first node of the SRAM cell for SNM measurement, the second segment of the original word line being coupled to the second node of the SRAM cell for SNM measurement, and an adjacent word line adjacent to the SRAM cell for SNM measurement being coupled to the SRAM cell for SNM measurement to form the word line of the SRAM cell for SNM measurement.

Besides, the word line, the first gate of the first MOS transistors and the second gate of the second MOS transistor are coupled to the first node and the second node are made of polysilicon. Two ends of the first segment of the original word line are respectively coupled to the first node and the bonding pads. Two ends of the second segment of the original word line are respectively coupled to the second node and the bonding pads. And, the adjacent word line adjacent to the SRAM cell is coupled as the third gate of the third MOS transistor and the fourth gate of the fourth MOS transistor.

In an SRAM for SNM measurement as described above, the original word line of the SRAM cell for SNM measurement is divided into two segments for SNM measurement, wherein one segment is connected to the first node of the SRAM cell for SNM measurement, whereas another segment is connected to the second node of the SRAM cell for SNM measurement. In addition, an adjacent word line adjacent to the SRAM cell for SNM measurement is connected to the SRAM cell for SNM measurement to form the word line of the SRAM cell. Therefore, the process of the SRAM for SNM measurement can be improved merely by modifying the mask for the layout of the polysilicon layers in conventional ones.

BRIEF DESCRIPTION OF THE DRAWINGS

The following detailed description, given by way of example and not intended to limit the invention solely to the embodiments described herein, will best be understood in conjunction with the accompanying drawings, in which.

DESCRIPTION OF THE PREFERRED EMBODIMENT

Figure 1:
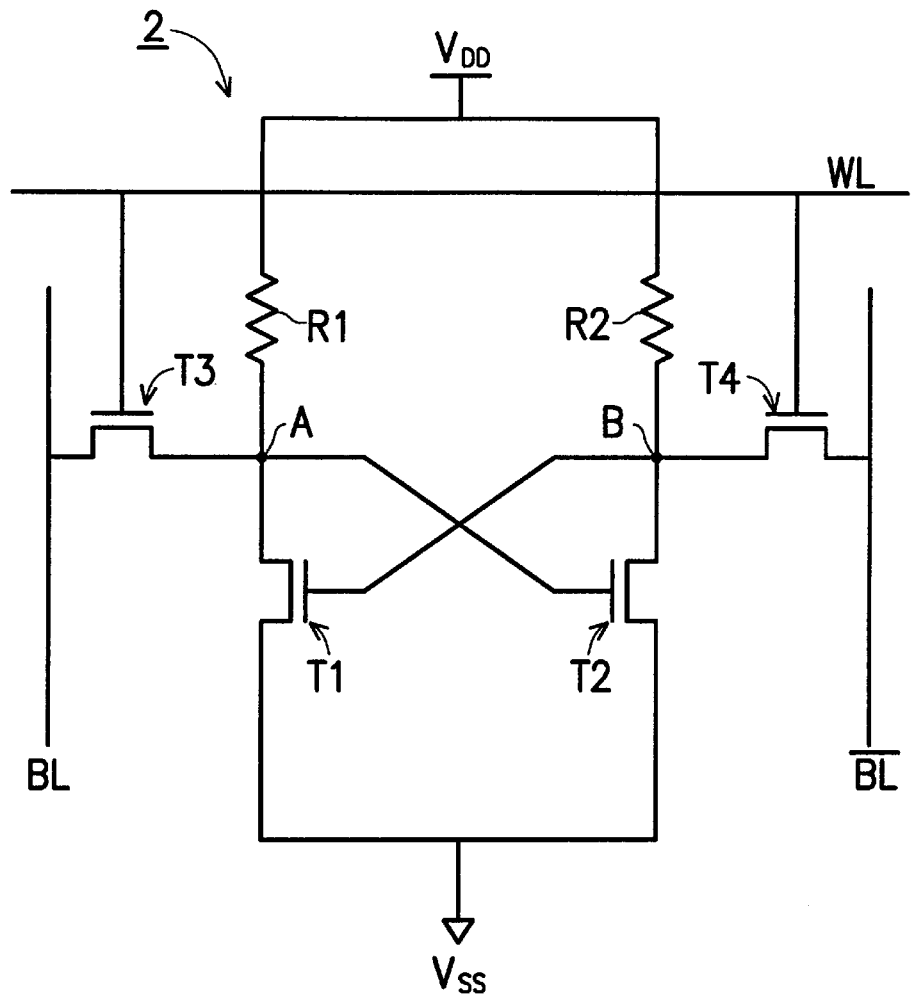
FIG. 1 (Prior Art) is a circuit diagram of an SRAM cell.
Figure 2:
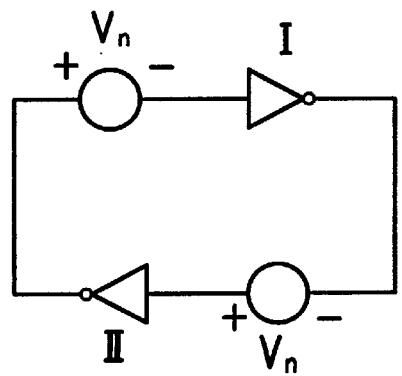
FIG. 2 (Prior Art) is an equivalent circuit diagram of the SRAM cell in FIG. 1.
Figure 3:
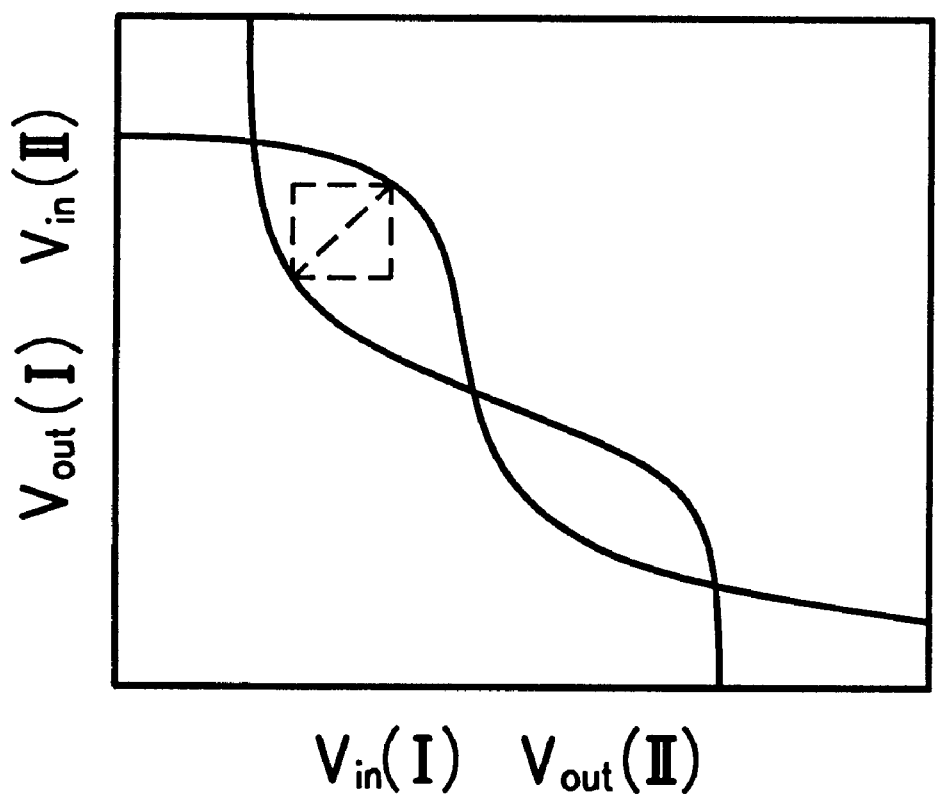
FIG. 3 (Prior Art) is a diagram of the voltage transfer characteristic of the circuit in FIG. 2.
Figure 4:
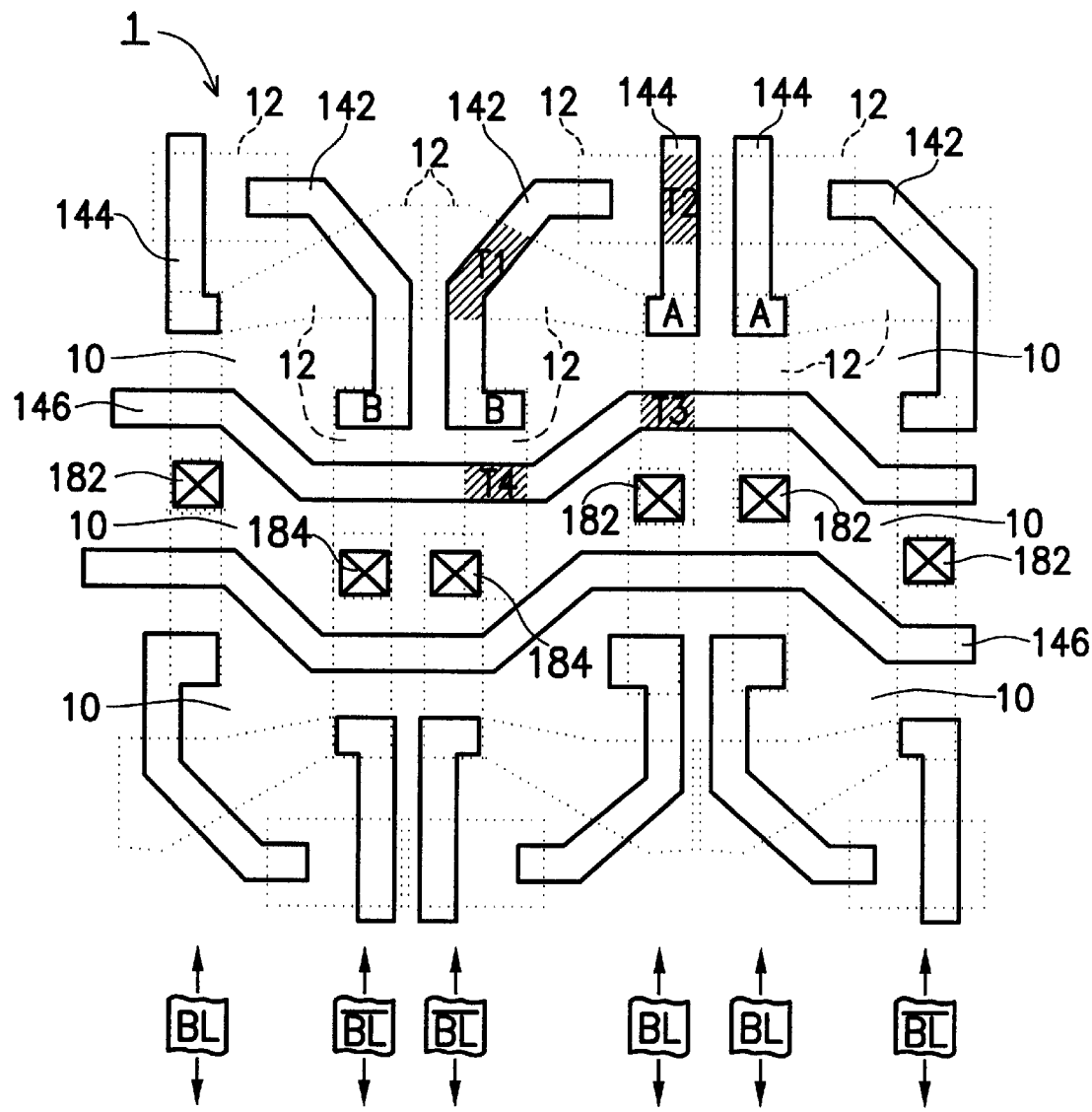
FIG. 4 (Prior Art) is a diagram of the layout of a conventional SRAM.
Figure 5:
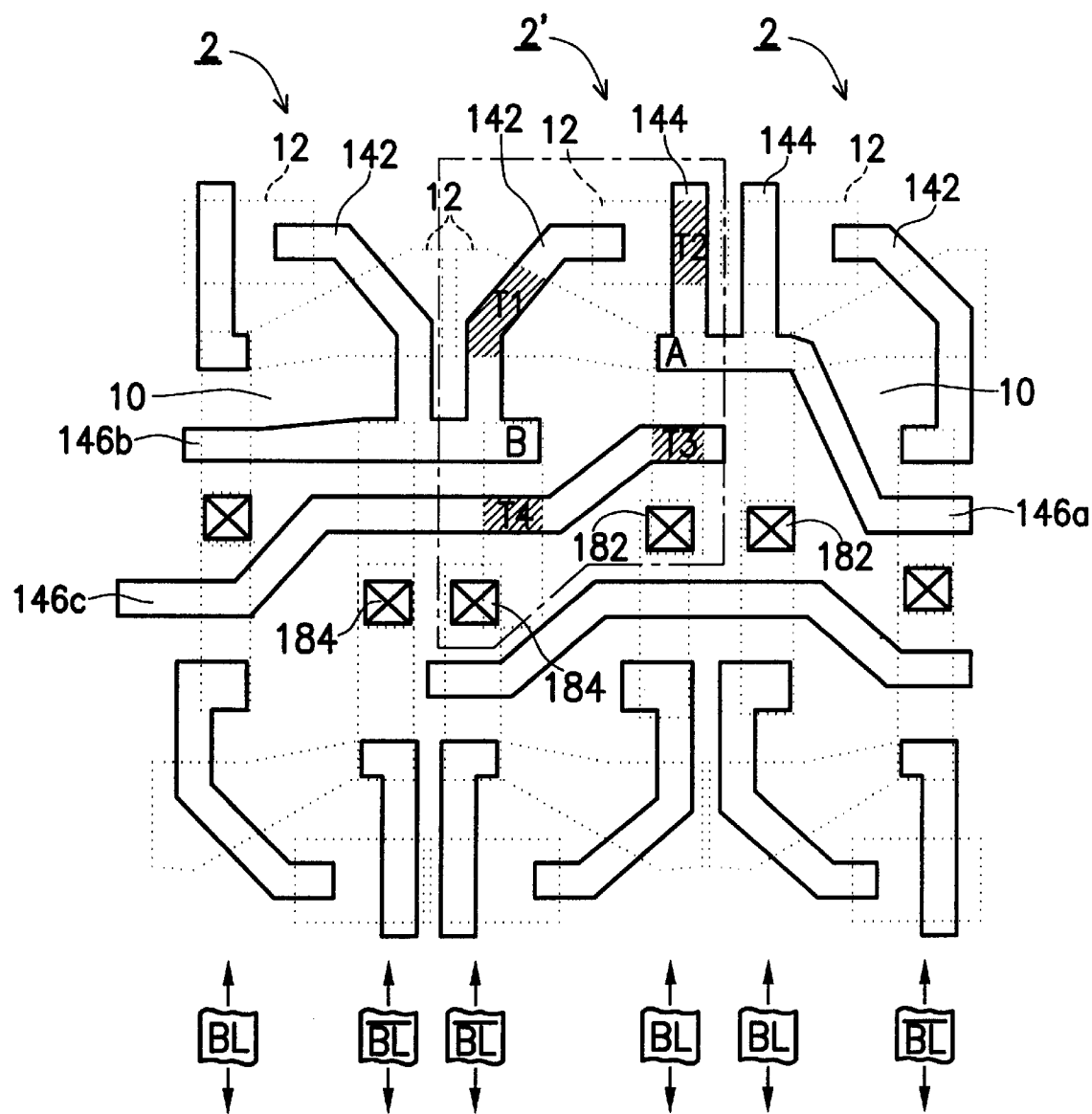
FIG. 5 is a diagram of the layout of the SRAM of the present invention.

Refer to FIG. 1 and FIG. 5, which are respectively a circuit diagram of an SRAM cell and a diagram of the layout of the SRAM in FIG. 1. Similar parts mentioned in FIG. 4 and FIG. 5 are labeled with the same element numbers and identifiers for convenience. The SRAM of the present invention is to form an SRAM array having an SRAM cell 2' for SNM measurement on a semiconductor substrate which has a plurality of bonding pads (not shown). The SRAM cell 2' comprises a first MOS transistor T1, a second MOS transistor T2, a third MOS transistor, a fourth MOS transistor T4, a first resistor R1 and a second resistor R2.

One of the drain and the source of the first MOS transistor T1 is connected to a first voltage source, like $V_{SS}$. One of the drain and the source of the second MOS transistor T2 is connected to the first voltage source, and the other one of the drain and the source is connected to the gate of the first MOS transistor to form a second node B. The gate of the second MOS transistor T2 is connected to the other one of the drain and the source of the first MOS transistor T1 to form the first node A. The first resistor R1 is connected between the first node A and a second voltage source, like $V_{DD}$. The second resistor R2 is connected to the second node B and the second voltage source. The drain and the source of the third MOS transistor T3 are respectively connected to the first node A and a first bit line BL, and the gate of the third MOS transistor T3 is connected to a word line WL. In addition, the drain and the source of the fourth MOS transistor T4 are respectively connected to the second node B and a second bit line $\overline{BL}$, and the gate of the fourth MOS transistor T4 is connected to the word line WL.

In FIG. 5, the original word line (word line 146 in FIG. 4) is divided into two segments 146a, 146b for SNM measurement, wherein the segment 146a is connected to the first node A of the SRAM cell 2' (the right end of the segment 146a is connected to the bonding pads (not shown)) and the segment 146b is connected to the second node B of the SRAM cell 2' (the right end of the segment 146b is connected to the bonding pads (not shown)). Further, the word line 146c adjacent to the SRAM cell 2' for SNM measurement is connected to the SRAM cell 2' for SNM measurement (the gate of the third MOS transistor T3 and the gate of the fourth MOS transistor T4 in the SRAM cell 2' for SNM measurement) to form the word line of the SRAM cell 2' for SNM measurement.

Though the present invention uses two rows of SRAM cells more than conventional one, the two rows of SRAM cells can be accomplished by redundant SRAM cells regularly formed in SRAM, therefore, the number of the SRAM cells in the SRAM for SNM measurement of the present invention is not reduced.

Further, the word lines (146a, 146b, 146c) and the gates (142, 144) of the MOS transistors (T1, T2) are all made of polysilicon, therefore, the SRAM for SNM measurement can be obtained only by modifying the mask for the layout of the polysilicon layers in conventional ones.

As discussed above, in an SRAM for SNM measurement of the present invention, the original word line of the SRAM cell for SNM measurement is divided into two segments for SNM measurement, wherein one segment is connected to the first node of the SRAM cell for SNM measurement, whereas another segment is connected to the second node of the SRAM cell for SNM measurement. In addition, an adjacent word line adjacent to the SRAM cell for SNM measurement is connected to the SRAM cell for SNM measurement to form the word line of the SRAM cell. Therefore, the process of the SRAM for SNM measurement can be improved merely by modifying the mask for the layout of the polysilicon layers in conventional ones.

The foregoing description of a preferred embodiment of the present invention has been provided for the purposes of illustration and description only. It is not intended to be exhaustive or to limit the invention to the precise forms disclosed. Many modifications and variations will be apparent to practitioners skilled in this art. The embodiment was chosen and described to best explain the principles of the present invention and its practical application, thereby enabling those who are skilled in the art to understand the invention for various embodiments and with various modifications as are suited to the particular use contemplated. It is intended that the scope of the invention be defined by the following claims and their equivalents.

What is claimed is:

1. An SRAM for SNM measurement, having an SRAM array on a semiconductor substrate with a plurality of bonding pads, said SRAM array having an SRAM cell for SNM measurement, and said SRAM cell comprising:

a first MOS transistor having a first gate, a first drain and a first source, one of said first drain and said first source being coupled to a first voltage source;

a second MOS transistor having a second gate, a second drain and a second source, one of said second drain and said second source being coupled to said first gate of said first MOS transistor to form a second node, and another one of said first drain and said first source of said first MOS transistor being coupled to said second gate of said second MOS transistor to form a first node;

a first resistor, coupled between said first node and a second voltage source;

a second resistor coupled between said second node and said second voltage source;

a third MOS transistor having a third gate, a third drain and a third source, said third drain and said third source being respectively coupled to said first node and a first bit line, and said third gate being coupled to a word line;

a fourth MOS transistor having a fourth gate, a fourth drain and a fourth source, said fourth drain and said fourth source being respectively coupled to said second node and a second bit line, and said fourth gate being coupled to said word line; and said SRAM cell for SNM measurement further comprising an original word line for SNM measurement having a first segment and a second segment, said first segment of said original word line being coupled to said first node of said SRAM cell for SNM measurement, said second segment of said original word line being coupled to said second node of said SRAM cell for SNM measurement, and an adjacent word line adjacent to said SRAM cell for SNM measurement being coupled to said SRAM cell foe SNM measurement to form said word line of said SRAM cell for SNM measurement.

2. An SRAM for SNM measurement, having an SRAM array on a semiconductor substrate with a plurality of bonding pads, said SRAM array having an SRAM cell for SNM measurement, and said SRAM cell comprising:

a first MOS transistor having a first polysilicon gate, a first drain and a first source, one of said first drain and said first source being coupled to a first voltage source;

a second MOS transistor having a second polysilicon gate, a second drain and a second source, one of said second drain and said second source being coupled to said first polysilicon gate of said first MOS transistor to form a second node, and another one of said first drain and said first source of said first MOS transistor being coupled to said second polysilicon gate of said second MOS transistor to form a first node;

a first resistor, coupled between said first node and a second voltage source;

a second resistor coupled between said second node and said second voltage source;

a third MOS transistor having a third polysilicon gate, a third drain and a third source, said third drain and said third source being respectively coupled to said first node and a first bit line, and said third polysilicon gate being coupled to a word line;

a fourth MOS transistor having a fourth polysilicon gate, a fourth drain and a fourth source, said fourth drain and said fourth source being respectively coupled to said second node and a second bit line, and said fourth polysilicon gate being coupled to said word line; and said SRAM cell for SNM measurement further comprising an original word line for SNM measurement having a first segment and a second segment, said first segment of said original word line being coupled to said first node of said SRAM cell for SNM measurement, said second segment of said original word line being coupled to said second node of said SRAM cell for SNM measurement, and an adjacent word line adjacent to said SRAM cell for SNM measurement being coupled to said SRAM cell for SNM measurement to form said word line of said SRAM cell for SNM measurement.

3. The SRAM for SNM measurement as cited in claim 1, wherein two ends of said first segment of said original word line are respectively coupled to said first node and said bonding pads, and two ends of said second segment of said original word line are respectively coupled to said second node and said bonding pads.

4. The SRAM for SNM measurement as cited in claim 2, wherein two ends of said first segment of said polysilicon original word line are respectively coupled to said first node and said bonding pads, and two ends of said second segment of said original polysilicon word line are respectively coupled to said second node and said bonding pads.

5. The SRAM for SNM measurement as cited in claim 3 or 4, wherein said adjacent word line adjacent to said SRAM cell is coupled as said third gate of said third MOS transistor and said fourth gate of said fourth MOS transistor.

\* \* \* \* \*